United States Patent
Hsiao et al.

(10) Patent No.: US 10,063,070 B2
(45) Date of Patent: Aug. 28, 2018

(54) BATTERY ACTIVE BALANCING SYSTEM

(71) Applicant: NATIONAL CHUNG SHAN INSTITUTE OF SCIENCE AND TECHNOLOGY, Taoyuan (TW)

(72) Inventors: Wei-Min Hsiao, Taoyuan (TW);
Kuo-Kuang Jen, Taoyuan (TW);
Jeng-Chyan Lin, Taoyuan (TW);
Hsun-Ming Hsien, Taoyuan (TW);
Fu-Min Fang, Taoyuan (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 0 days.

(21) Appl. No.: 15/361,321

(22) Filed: Nov. 25, 2016

(65) Prior Publication Data

US 2018/0152028 A1    May 31, 2018

(51) Int. Cl.
*H02J 7/00* (2006.01)
*H01M 10/48* (2006.01)
(Continued)

(52) U.S. Cl.
CPC .......... *H02J 7/0019* (2013.01); *H01M 10/425* (2013.01); *H01M 10/441* (2013.01);
(Continued)

(58) Field of Classification Search
CPC ............. H01M 10/425; H01M 10/441; H01M 10/482; H02J 7/35; H25J 7/0019
(Continued)

(56) References Cited

U.S. PATENT DOCUMENTS

| 7,081,737 | B2 * | 7/2006 | Liu et al. | ............ H01M 10/441 320/130 |
| 7,795,837 | B1 * | 9/2010 | Haun et al. | ......... H01M 10/441 136/244 |

(Continued)

*Primary Examiner* — Sun Lin
(74) *Attorney, Agent, or Firm* — WPAT, PC

(57) ABSTRACT

A battery active-balancing system comprises an external balancing power; a buck converter having a first side-winding and a second side-winding induced thereby, the first side-winding and the second side-winding each having a positive terminal and a negative terminal; a battery comprising series-connected cell-units each having a positive terminal and a negative terminal; a cell voltage-sensing unit coupled to the battery to sense a voltage of each cell unit of the series-connected cell-units; a main switch component coupled to the first side-winding and the battery in an ON state, or coupled to the first side-winding and the external balancing power in an OFF state; a cell-switch unit comprising first cell-switch components and second cell-switch components, wherein each of the first cell-switch components is coupled to the positive terminal of corresponding one cell-unit and the positive terminal of the second side-winding, and each of the second cell-switch components is coupled to the negative terminal of corresponding one cell-unit and the negative terminal of the second side-winding; and a microcontroller for controlling the main switch component and the cell-switch unit, and determining a voltage level fed back from the cell voltage-sensing unit.

10 Claims, 4 Drawing Sheets

(51) Int. Cl.
*H01M 10/44* (2006.01)
*H01M 10/42* (2006.01)
*H02J 7/35* (2006.01)

(52) U.S. Cl.
CPC ............ *H01M 10/482* (2013.01); *H02J 7/35* (2013.01); *H01M 2010/4271* (2013.01)

(58) Field of Classification Search
USPC ......................................................... 320/101
See application file for complete search history.

(56) References Cited

U.S. PATENT DOCUMENTS

| | | | | |
|---|---|---|---|---|
| 8,773,070 B2* | 7/2014 | Kang et al. | ........... | H02J 7/0016 320/118 |
| 9,203,121 B2* | 12/2015 | Liu | ........ | H02J 7/0016 |
| 9,225,179 B2* | 12/2015 | Liu | ........ | H02J 7/0019 |
| 2010/0201317 A1* | 8/2010 | Shiu et al. | ............ | H02J 7/0018 320/116 |
| 2012/0104856 A1* | 5/2012 | Gottlieb et al. | .......... | H02J 1/10 307/66 |
| 2013/0093395 A1* | 4/2013 | Liu et al. | ............... | H02J 7/0019 320/118 |
| 2013/0187605 A1* | 7/2013 | Potts | ...................... | H02J 7/0052 320/112 |
| 2013/0278218 A1* | 10/2013 | Onnerud et al. | .... | H01M 10/441 320/118 |
| 2013/0314027 A1* | 11/2013 | Li et al. | ................. | H02J 7/0016 320/107 |
| 2014/0312828 A1* | 10/2014 | Vo et al. | ........... | H01M 10/4257 320/103 |
| 2015/0214757 A1* | 7/2015 | Zane et al. | ............. | H02J 7/0021 320/107 |
| 2016/0094063 A1* | 3/2016 | Wu | ....................... | H02J 7/0019 320/112 |
| 2016/0141895 A1* | 5/2016 | Liu | ....................... | H02J 7/0016 320/103 |

* cited by examiner

BATTERY ACTIVE BALANCING SYSTEM

FIELD OF THE INVENTION

The present invention relates to battery active balancing systems and, more particularly, to a battery active balancing system and a method of controlling the same, characterized in that the battery active balancing system is both timing-oriented (charging, discharging, idle) and battery-oriented (i.e., capable of performing active balancing on any series-connected cell unit.)

BACKGROUND OF THE INVENTION

Although lithium-ion batteries are robust and highly safe, they must not be overcharged, over-discharged, or overheated. To extend the service life of batteries and ensure user safety, it is necessary to build a battery management system (BMS) to make sure that the batteries always operate safely. The main function of the BMS is to measure a cell's voltage and protect the cell. When it comes to a series-connected battery, its cells differ in terms of voltage, because the cells have different internal resistance levels or undergo different processes. As a result, the performance and service life of the series-connected battery will be greatly reduced, if one of its cells is overcharged or over-discharged.

In practice, there is always a tiny difference in the internal resistance and capacity between the cells. The difference not only increases with the number of charging-discharging cycles over time, but also develops between battery modules as a result of poor management. Regarding the latter consequence, inconsistency of the battery modules causes overcharging and over-discharging to the battery earlier than expected. The inconsistency, whether attributed to the cells or the modules, must be corrected with an appropriate management system in order for the battery to function well. To this end, a balancing mechanism is required for the battery. Hence, both the BMS and the balancing mechanism are of vital importance.

Regardless of its performance, a conventional management system is always built in any low-voltage apparatus. For instance, sophisticated battery management technology is applicable to a wide variety of handheld apparatuses. IC manufacturers, such as Texas Instrument, Linear Technology, and Maxim, manufacture commercial chips dedicated to battery management ICs and widely applicable to handheld electronic products. However, the dedicated battery management ICs are usually intended for batteries with a low capacity and a few series/parallel connections but seldom come with a built-in cell balancing mechanism.

Issues arising from an unbalance between cells or between modules are no longer negligible whenever batteries are upgraded and applied to large power storage applications like a high-voltage energy-storing system or an electric bus. Take electrically-driven vehicles as an example, the most notorious drawbacks include high battery prices and short service life; the drawbacks are there, because conventional battery management technology is rarely effective in ensuring a balance between cells or between modules. As a result, the riskiest cell is always the first one to trigger management system protection earlier than expected and thus suspends its operation, thereby deteriorating the performance of the battery. Furthermore, the management system might fail to protect the riskiest cell timely, and thus the riskiest cell ends up being overcharged or over-discharged, thereby shortening the service life of an energy-storing device.

Conventional uniform battery balancing is of two types: active balancing and passive balancing. A cell balancing mechanism is one of the important factors in extending battery endurance. Primitive battery management systems are based on passive balancing.

Passive balancing works by lengthy power consumption of a series-connected battery without taking the initiative in increasing the power level of the cell with the lowest voltage or power level in the series-connected battery, as its name suggests. Although passive balancing requires a simple circuit and incurs low costs, passive balancing is disadvantaged by its low efficiency and lengthy balancing process, thereby rendering it inapplicable to high-capacity batteries.

Active balancing involves charging a cell of a battery whenever the cell is operating at the lowest possible voltage, so as to increase the voltage of the cell to a level as high as another cell operating at the highest voltage, and then performing the aforesaid process on the other cells until the voltages of all the cells are balanced. Depending on its operating principle, active balancing falls into three categories: inductive balancing, capacitive balancing, and multiple winding transformer balancing.

Both inductive balancing and capacitive balancing require a series-connected battery connected to a uniform balancing secondary circuit in parallel. The uniform balancing secondary circuit comprises inductors or capacitors and switches. The cell with the highest voltage or power level is detected, and then the electrical energy of the cell thus detected is stored in the inductors or capacitors. Afterward, the uniform balancing secondary circuit is switched by a switch circuit to a cell with the lowest voltage or power level. The aforesaid steps are repeated until all the cells have their voltages or power levels uniformly balanced. However, both inductive balancing and capacitive balancing have disadvantages as follows: the energy conversion is limited by the capacity of the inductors or capacitors; balancing takes much time; inductive balancing and capacitive balancing are not applicable to scenarios where lithium-ion batteries allow high-current charging-discharging.

Multiple winding transformer balancing requires a transformer with multiple secondary windings and each winding externally connected to a switch circuit. Multiple winding transformer balancing not only entails charging a series-connected battery but also enables a switch to charge a cell with a low voltage or power level. The aforesaid charging performed by multiple winding transformer balancing is deemed constant voltage charging, because multiple secondary windings always require the same number of windings. Furthermore, when all the control switches are ON to charge all the cells, the battery are charged to a lesser extent when having a high power level, but to a larger extent when having a low power level; hence, it does not take much time charging before a balance is attained. But, in practice, coupling winding is accompanied by mutual induction and induction leaks, and in consequence it is impossible for the cells to acquire the same voltage level despite the same number of windings, not to mention that the multiple windings take up much space.

Intensive series-connection applications usually necessitate distributed battery management by modularization. Even if conventional battery management systems are capable of balancing the cells of each module, conventional battery management systems cannot ensure a balance between the modules. Inconsistency of the modules inevitably brings about inconsistency of battery operating states, thereby rendering module balancing futile.

SUMMARY OF THE INVENTION

The present invention features a self-contained balancing power source which operates in conjunction with a switch circuit to overcome the aforesaid drawbacks of the prior art. The present invention relies upon a self-contained power source or uses a series-connected battery as a power source which, coupled with a switch circuit for switching to any cell, performs active balancing on the cells. The self-contained power source, coupled with an external power supply or an electronic flyback power converter, not only allows the same charging power source to be isolated and grounded but also converts its voltage into a charging voltage required for the cells, so as to perform high-energy balancing charging on the cell with the lowest voltage continuously. The active balancing of the present invention is performed while a battery is being charged or discharged, or idle, and achieve a battery balance in a short period of time.

In order to achieve the above and other objectives, the present invention provides a battery active balancing system, comprising: an external balancing power; a buck converter having a first side winding and a second side winding induced by the first side winding, wherein the first side winding and the second side winding each have a positive terminal and a negative terminal; a battery comprising a plurality of cell units connected in series, with the cell units each having a positive terminal and a negative terminal; a cell voltage sensing unit coupled to the battery to sense a voltage of each said cell unit; a main switch component coupled to the first side winding and the battery or the external balancing power, with the main switch component being coupled to the first side winding and the external balancing power in an ON state and being coupled to the first side winding and the battery in an OFF state; a cell switch unit comprising a plurality of first cell switch components and a plurality of second cell switch components, wherein the first cell switch components are coupled to the positive terminals of the cell units and the second side winding, respectively, and the second cell switch components are coupled to the negative terminals of the cell units and the second side winding, respectively; and a microcontroller coupled to the main switch component, the cell switch unit, and the cell voltage sensing unit to control the main switch component and the cell switch unit, calculate and determine a voltage level fed back from the cell voltage sensing unit.

In an embodiment of the present invention, at least one cell unit is a lowest-voltage cell unit, and at least one cell unit is a highest-voltage cell unit.

In an embodiment of the present invention, the external balancing power originates from renewable energy or utility electricity.

In an embodiment of the present invention, the renewable-energy power is solar power or wind power.

In an embodiment of the present invention, the microcontroller keeps monitoring a voltage of each said cell unit when the main switch component is ON and the battery is being charged, wherein, when a voltage difference between the lowest-voltage cell unit and the highest-voltage cell unit is larger than a balancing threshold, first cell switch components and second cell switch components of the lowest-voltage cell unit are enabled so as to start a balancing process, and the lowest-voltage cell unit is defined as a cell unit which is undergoing the balancing process, wherein the balancing process stops as soon as the voltage of the cell unit undergoing the balancing process is higher than an average voltage of the battery.

In an embodiment of the present invention, as soon as the voltage of any one of the cell units reaches a high voltage threshold, the battery is stopped being charged, and the microcontroller keeps monitoring the voltage of each said cell unit, sorts the cell units according to voltage, and enables the first and second cell switch components corresponding to the cell units in a voltage-increasing order, until each said cell unit is charged to reach the high voltage threshold.

In an embodiment of the present invention, the microcontroller keeps monitoring a voltage of each said cell unit when the main switch component is in an ON state and the battery is being discharged, wherein, when a voltage difference between the lowest-voltage cell unit and the highest-voltage cell unit is larger than a balancing threshold and a voltage of the lowest-voltage cell unit is lower than a predetermined balancing initial value but higher than a low voltage threshold, the first cell switch components and the second cell switch components of the lowest-voltage cell unit are enabled so as to start a balancing process, and the lowest-voltage cell unit is defined as a cell unit which is undergoing the balancing process, wherein the balancing process stops as soon as a voltage difference between the cell unit being balanced and the lowest-voltage cell unit of the battery is larger than a balancing cutoff value.

In an embodiment of the present invention, the microcontroller keeps monitoring a voltage of each said cell unit when the main switch component is in an ON state and the battery is idle, wherein, when a voltage difference between the lowest-voltage cell unit and the highest-voltage cell unit is larger than a balancing threshold, the first cell switch components and the second cell switch components of the lowest-voltage cell unit are enabled so as to start a balancing process, and the lowest-voltage cell unit is defined as a cell unit which is undergoing the balancing process, wherein the balancing process stops as soon as a voltage of the cell unit being balanced is higher than an average voltage of the battery.

In an embodiment of the present invention, the microcontroller keeps monitoring a voltage of each said cell unit when the main switch component is in an OFF state and the battery is being discharged, wherein, when a voltage difference between the lowest-voltage cell unit and the highest-voltage cell unit is larger than a balancing threshold and a voltage of the lowest-voltage cell unit is lower than a predetermined balancing initial value but higher than a low voltage threshold, the first cell switch components and the second cell switch components of the lowest-voltage cell unit are enabled so as to start a balancing process, and the lowest-voltage cell unit is defined as a cell unit which is undergoing the balancing process, wherein the balancing process stops as soon as a voltage difference between the cell unit being balanced and the lowest-voltage cell unit of the battery reaches a balancing cutoff value.

In an embodiment of the present invention, the microcontroller keeps monitoring a voltage of each said cell unit when the main switch component is in an OFF state and the battery is idle, wherein, when a voltage difference between the lowest-voltage cell unit and the highest-voltage cell unit is larger than a balancing threshold, the first cell switch components and the second cell switch components of the lowest-voltage cell unit are enabled so as to start a balancing process, and the lowest-voltage cell unit is defined as a cell unit which is undergoing the balancing process, wherein the balancing process stops as soon as a voltage of the cell unit being balanced is higher than an average voltage of the battery.

Accordingly, the present invention provides a charging technique and a discharging technique which are based on a battery active balancing circuit to preclude inconsistency in cell capacity and internal resistance between series-connected cells of a battery, as the inconsistency disadvantageously leads to premature overcharging and premature over-discharging. The present invention further provides a two-stage charging technique with a view to charging each cell to the full without being overcharged, thereby extending battery endurance.

In case of a large difference in cell capacity and internal resistance between the cells, the present invention can charge the series-connected cells to the full without overcharging them, and extend the service life of the battery by discharging balancing. Therefore, the charging and discharging balancing solution provided by the present invention is effective in extending battery endurance without any additional hardware.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION OF THE PREFERRED EMBODIMENTS

Figure 1:
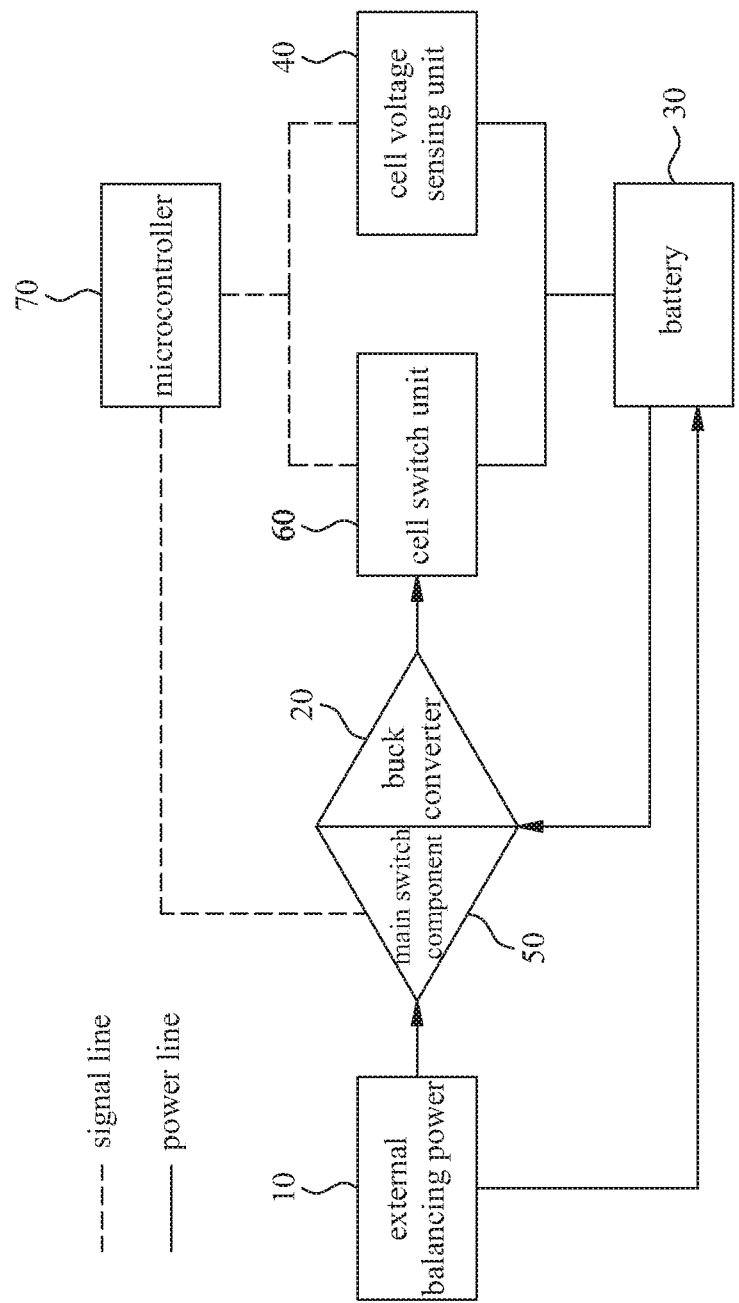
FIG. 1 is a block diagram of a battery active balancing system according to an embodiment of the present invention.
Figure 2:
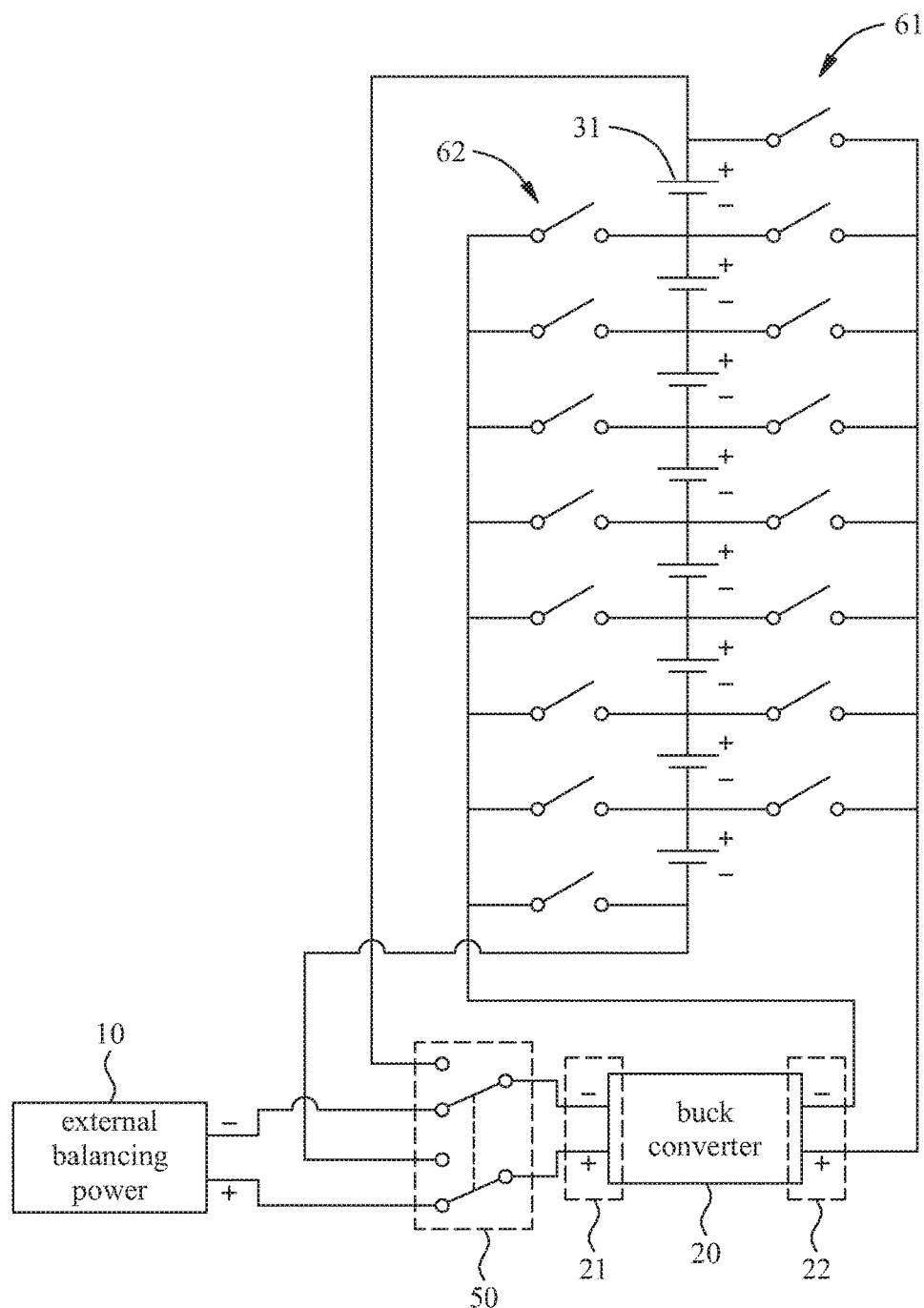
FIG. 2 is a circuit diagram of the battery active balancing system according to the embodiment of the present invention, showing a balancing power source provided in the form of an external power source.

FIG. 1 is a block diagram of a battery active balancing system 1 according to an embodiment of the present invention. FIG. 2 is a circuit diagram of the battery active balancing system 1 according to the embodiment of the present invention, showing a balancing power source provided in the form of an external power source. The battery active balancing system 1 comprises an external balancing power 10, a buck converter 20, a battery 30, a cell voltage sensing unit 40, a main switch component 50, a cell switch unit 60 and a microcontroller 70.

The external balancing power 10 originates from renewable energy or utility electricity, and it is supplied by an external power supply. Preferably, the renewable-energy power is solar power or wind power.

The buck converter 20 has a first side winding 21 and a second side winding 22 induced by the first side winding 21. The first side winding 21 and the second side winding 22 each have a positive terminal and a negative terminal. The buck converter 20 is an electronic flyback power converter.

The battery 30 comprises a plurality of cell units 31 connected in series. The cell units 31 each have a positive terminal and a negative terminal. At least one cell unit 31 is a lowest-voltage cell unit 311, and at least one cell unit 31 is a highest-voltage cell unit 312.

The cell voltage sensing unit 40 is coupled to the battery 30 to sense the voltage of each cell unit 31.

The main switch component 50 is coupled to the first side winding 21 of the buck converter 20 and the battery 30 or the external balancing power 10. When it is ON, the main switch component 50 is coupled to the first side winding 21 and the external balancing power 10. When it is OFF, the main switch component 50 is coupled to the first side winding 21 and the battery 30.

The cell switch unit 60 comprises a plurality of first cell switch components 61 and a plurality of second cell switch components 62. The first cell switch components 61 are coupled to the positive terminals of the cell units 31 and the second side winding 22. The second cell switch components 62 are coupled to the negative terminals of the cell units 31 and the second side winding 22.

The microcontroller 70 is coupled to the cell voltage sensing unit 40, the main switch component 50 and the cell switch unit 60 to not only control the main switch component 50 and the cell switch unit 60 but also calculate and determine the voltage level sensed by the cell voltage sensing unit 40.

Figure 3:
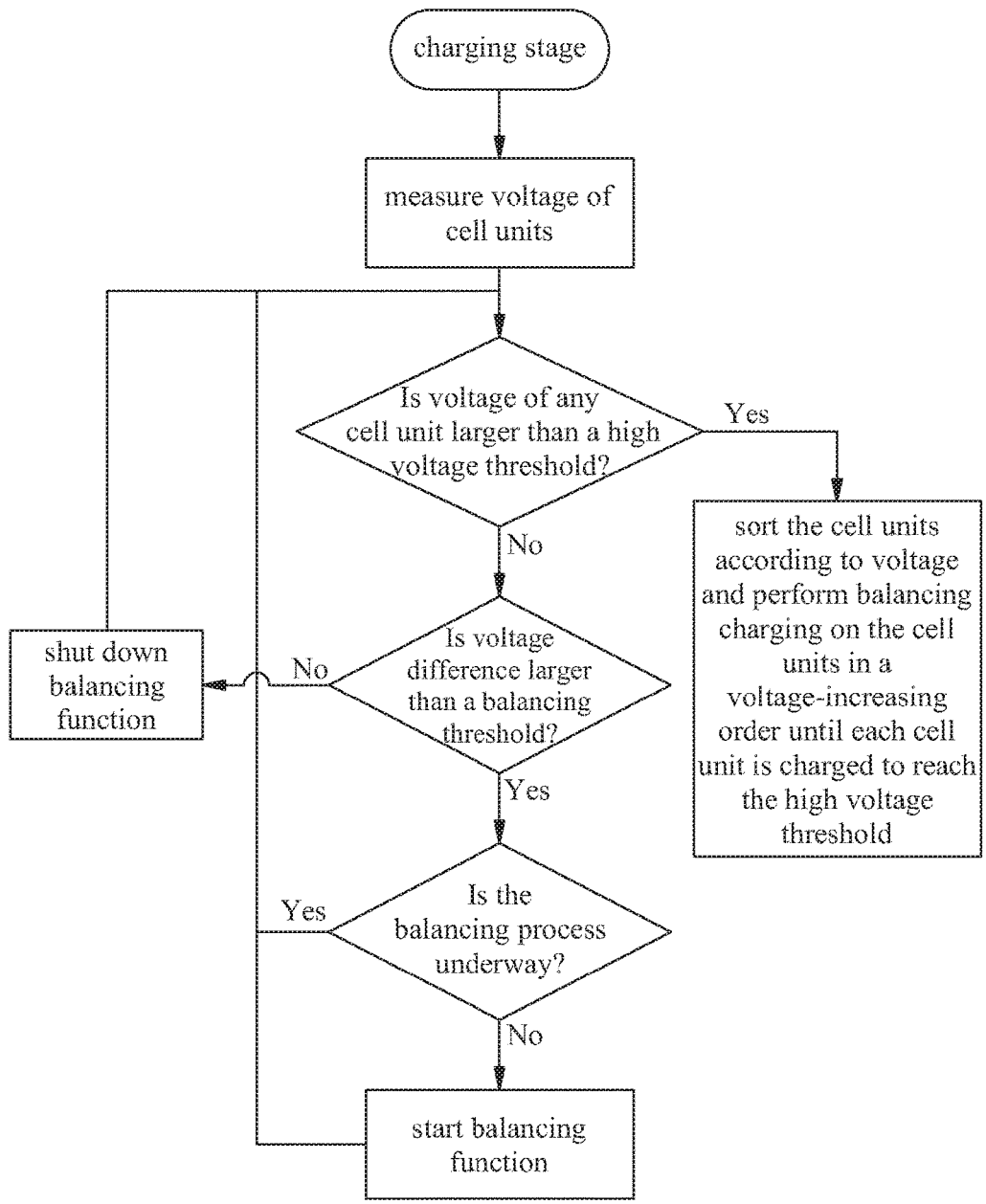
FIG. 3 is a flow chart of how to effectuate balancing during a charging process performed with the battery active balancing system according to the embodiment of the present invention.
Figure 4:
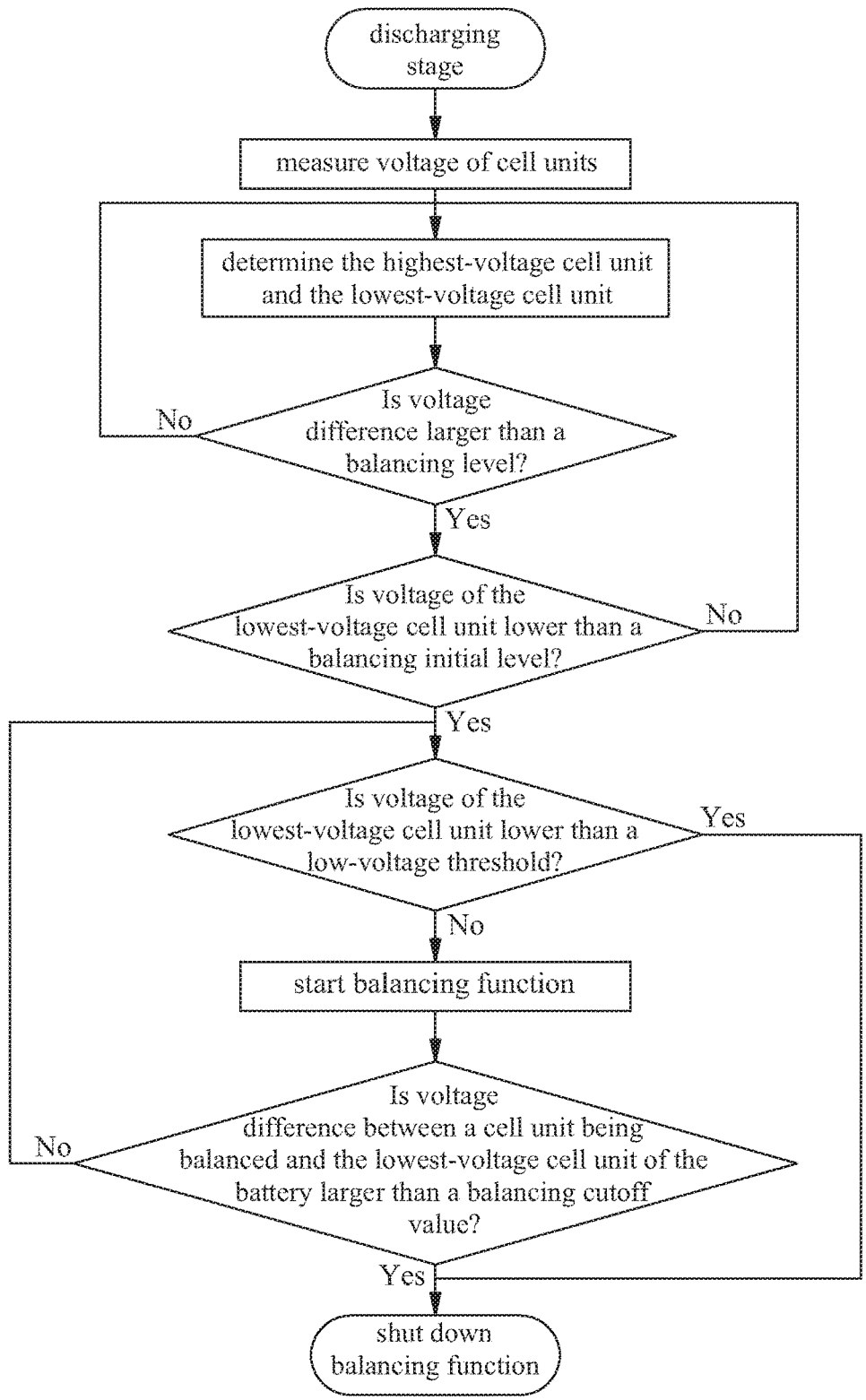
FIG. 4 is a flow chart of how to effectuate balancing during a discharging process performed with the battery active balancing system according to the embodiment of the present invention.

Referring to FIG. 2~FIG. 4, the balancing technique for use by the battery active balancing system 1 is described below.

In practice, according to the present invention, the battery active balancing system 1 has a maximum balancing current of 6 A, whereas the voltage difference between the cell units 31 after the balancing process does not exceed 30 mV. Take the battery 30 comprising 16 series-connected cell units 31 (but the present invention is not limited thereto) as an example, the battery active balancing system 1 has the external balancing power 10 of 48V (which is provided in the form of solar power, wind power or utility electricity), or the battery 30 itself has its operating voltage decreased from 48V to 5.0V by the buck converter 20 to therefore form an active balancing loop together with the cell switch components 61, 62. Regardless of whether the external balancing power 10 is available to the battery active balancing system 1, the microcontroller 70 always keeps monitoring the voltage of the cell units 31 to determine whether to open a balancing circuit channel in various ways described below.

(1) If the external balancing power 10 is available, and the battery 30 is being charged, the charging process will take place in two stages as follows:

(1-1) First stage: series-charging stage. If the battery 30 runs out of electrical power, the external balancing power 10 will charge the battery 30 by delivering a first current I1 from the external balancing power 10 to the series-charging the battery 30. In this stage, the microcontroller 70 measures the voltage of each cell unit 31 and detects the lowest-voltage cell unit 311, whereas the voltage of the external balancing power 10 is decreased from 48V to 5V with the buck converter 20. When the voltage difference between the lowest-voltage cell unit 311 and the highest-voltage cell unit 312 is larger than 30 mV, the two switch components (first cell switch components 61 and second cell switch components 62) corresponding to the lowest-voltage cell unit 311 are enabled, and the buck converter 20 introduces a second current I2 to the lowest-voltage cell unit 311; meanwhile, the lowest-voltage cell unit 311 has currents I1+I2, whereas the other cell units 31 have a current I1, thereby quickly increasing the voltage of the lowest-voltage cell unit 311 until the voltage equals the average voltage of the battery 30.

In the first stage, the series-connected charging process will end, provided that the voltage of any cell unit 31 of the battery 30 exceeds 3.60V (high voltage threshold), so as to prevent overcharging the cell unit 31 of the battery 30 and thus compromising the functioning status, capacity and internal resistance of the cell unit 31. The battery 30 usually operates with at least 80% of rated capacity after the series-connected charging process in the first stage has ended.

(1-2) Second stage: separate-charging stage. The objective of the separate-charging stage is to charge each cell unit 31 of the battery 30 to the full by an active balancing circuit such that the battery 30 attains a balance between the cell units 31. During the first stage charging process, if any cell unit 31 reaches the high voltage threshold (3.6V), the first stage will end to start the second stage so as to allow the cell units 31 to undergo balancing charging. Upon entry into the separate-charging stage, the microcontroller 70 sorts the voltages of the cell units 31 and performs balancing charging on the cell units 31 in a voltage-increasing order. If a balanced cell unit 31 reaches the high voltage threshold (3.6V), the next cell unit 31 will undergo balancing; the process repeats until all the cell units 31 are fully balanced, thereby bringing the charging process to an end. With reference to the information pertaining to the cell units 31, the microcontroller 70 determines that the battery 30 has undergone the two stages, thereby ending the charging process of the two stages.

(2) If the external balancing power 10 is available, and the battery 30 is being discharged, a balancing mechanism for postponing over-discharging the cell units 31 will be performed. If the voltages of the cell units 31 are overly discrete and lower than a configured balancing initial value, the active balancing of the battery 30 will start, so as to charge the cell units 31 with the external balancing power 10 on a supplementary basis with a view to postponing the over-discharging of the cell units 31 such that the series-connected cell units 31 will become over-discharged simultaneously, thereby postponing the premature over-charging of the riskiest cell unit 31.

(3) If the external balancing power 10 is available, the battery 30 is idle, and the voltages of the cell units 31 are overly discrete, the active balancing of the battery 30 will start, so that discrete low-voltage cell units are balanced by the external balancing power 10 to attain the average voltage of the battery 30.

(4) If the external balancing power 10 is unavailable, and the battery 30 is being discharged, a balancing mechanism for postponing the over-discharging of the cell units 31 will be performed. If the voltages of the cell units 31 are overly discrete and lower than a configured balancing initial value, the active balancing mechanism for the battery 30 will start such that the battery 30 with the riskiest cell unit will be charged by the buck converter 20 on a supplementary basis with a view to postponing the over-discharging of the cell units 31, thereby allowing the series-connected cell units 31 to reach an over-discharged status simultaneously (the cell units 31 supplement each other and thereby postpone the premature over-discharging of the riskiest cell unit.)

(5) If the external balancing power 10 is unavailable, the battery 30 is idle, and the voltages of the cell units 31 are overly discrete, the active balancing mechanism for the battery 30 will start such that the battery 30 with the riskiest cell unit will be charged by the buck converter 20 on a supplementary basis with a view to balancing the cell units 31 until their voltages are equal.

Therefore, during a battery charging process, a battery active balancing system of the present invention ensures that all the cell units will be charged to the full but will never be overcharged, so as for the cell units to maintain their optimal performance and lengthen their service life. During a battery discharging process, the battery active balancing system of the present invention is effective in postponing the over-discharging of those cell units which are relatively risky such that the other series-connected cell units can keep supplying power until they reach the limits of their maximum capacity and thus will not be over-discharged prematurely because of the riskier cell units. Accordingly, due to the battery active balancing system of the present invention, the battery protected by the BMS is unlikely to stop supplying power as a whole and thus fail to release residual power.

Therefore, the battery active balancing system of the present invention is effective in charging all the cell units to the full during a battery charging process, and postponing the premature over-discharging of risky cell units during a battery discharging process, so as to extend battery endurance during both the charging process and the discharging process.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A battery active balancing system, comprising:
   an external balancing power;
   a buck converter having a first side winding and a second side winding induced by the first side winding, wherein the first side winding and the second side winding each has a positive terminal and a negative terminal;
   a battery comprising a plurality of cell units connected in series, with each cell unit having a positive terminal and a negative terminal;
   a cell voltage sensing unit coupled to the battery to sense a voltage of said each cell unit;
   a main switch component, coupled to the first side winding, the battery, and the external balancing power, wherein the main switch component connects the first side winding and the external balancing power in an ON state, and connects the first side winding and the battery in an OFF state;
   a cell switch unit comprising a plurality of first cell switch components and a plurality of second cell switch components, wherein each of the first cell switch components is coupled to the positive terminal of corresponding one of the cell units and the positive terminal of the second side winding, and each of the second cell switch components is coupled to the negative terminal of corresponding one of the cell units and the negative terminal of the second side winding; and
   a microcontroller coupled to the main switch component, the cell switch unit, and the cell voltage sensing unit to control the main switch component and the cell switch unit, to calculate and to determine a voltage level fed back from the cell voltage sensing unit.

2. The battery active balancing system of claim 1, wherein the external balancing power originates from a renewable energy or a utility electricity.

3. The battery active balancing system of claim 2, wherein the renewable energy is generated from one of solar power and wind power.

4. The battery active balancing system of claim 1, wherein at least one cell unit is a lowest-voltage cell unit, and at least one cell unit is a highest-voltage cell unit.

5. The battery active balancing system of claim 4, wherein the microcontroller keeps monitoring a voltage of said each cell unit when the main switch component is in the ON state and the battery is being charged, wherein when a voltage difference between the lowest-voltage cell unit and the highest-voltage cell unit is larger than a balancing threshold, the first cell switch component and the second cell switch component of the lowest-voltage cell unit are enabled so as to start a balancing process, and the lowest-voltage cell unit is defined as a cell unit which is undergoing the balancing process, wherein the balancing process stops as soon as the voltage of the cell unit undergoing the balancing process is higher than an average voltage of the battery.

6. The battery active balancing system of claim 5, wherein, as soon as the voltage of any one of the cell units reaches a high voltage threshold, the battery is stopped being charged, and the microcontroller keeps monitoring the voltage of said each cell unit, sorts the cell units according to voltages of the cell units, and enables the first cell switch components and the second cell switch components corresponding to the cell units in a voltage-increasing order, until said each cell unit is charged to reach the high voltage threshold.

7. The battery active balancing system of claim 4, wherein the microcontroller keeps monitoring a voltage of said each cell unit when the main switch component is in the ON state and the battery is being discharged, wherein when a voltage difference between the lowest-voltage cell unit and the highest-voltage cell unit is larger than a balancing threshold and a voltage of the lowest-voltage cell unit is lower than a predetermined balancing initial value but higher than a low voltage threshold, the first cell switch component and the second cell switch component of the lowest-voltage cell unit are enabled so as to start a balancing process, and the lowest-voltage cell unit is defined as a cell unit which is undergoing the balancing process, wherein the balancing process stops as soon as a voltage difference between the cell unit being balanced and the lowest-voltage cell unit of the battery is larger than a balancing cutoff value.

8. The battery active balancing system of claim 4, wherein the microcontroller keeps monitoring a voltage of said each cell unit when the main switch component is in the ON state and the battery is idle, wherein when a voltage difference between the lowest-voltage cell unit and the highest-voltage cell unit is larger than a balancing threshold, the first cell switch component and the second cell switch component of the lowest-voltage cell unit are enabled so as to start a balancing process, and the lowest-voltage cell unit is defined as a cell unit which is undergoing the balancing process, wherein the balancing process stops as soon as a voltage of the cell unit being balanced is higher than an average voltage of the battery.

9. The battery active balancing system of claim 4, wherein the microcontroller keeps monitoring a voltage of said each cell unit when the main switch component is in the OFF state and the battery is being discharged, wherein when a voltage difference between the lowest-voltage cell unit and the highest-voltage cell unit is larger than a balancing threshold and a voltage of the lowest-voltage cell unit is lower than a predetermined balancing initial value but higher than a low voltage threshold, the first cell switch component and the second cell switch component of the lowest-voltage cell unit are enabled so as to start a balancing process, and the lowest-voltage cell unit is defined as a cell unit which is undergoing the balancing process, wherein the balancing process stops as soon as a voltage difference between the cell unit being balanced and the lowest-voltage cell unit of the battery reaches a balancing cutoff value.

10. The battery active balancing system of claim 4, wherein the microcontroller keeps monitoring a voltage of said each cell unit when the main switch component is in the OFF state and the battery is idle, wherein when a voltage difference between the lowest-voltage cell unit and the highest-voltage cell unit is larger than a balancing threshold, the first cell switch component and the second cell switch component of the lowest-voltage cell unit are enabled so as to start a balancing process, and the lowest-voltage cell unit is defined as a cell unit which is undergoing the balancing process, wherein the balancing process stops as soon as a voltage of the cell unit being balanced is higher than an average voltage of the battery.

* * * * *